United States Patent
Shin et al.

(10) Patent No.: US 10,767,107 B2
(45) Date of Patent: Sep. 8, 2020

(54) HYBRID ORGANIC/INORGANIC QUANTUM DOT COMPOSITE AND METHOD FOR PREPARING THE SAME

(71) Applicant: LG ELECTRONICS INC., Seoul (KR)

(72) Inventors: Hyunkwon Shin, Seoul (KR); Moongoo Choi, Seoul (KR); Dongseon Jang, Seoul (KR); Jinwoo Sung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 327 days.

(21) Appl. No.: 15/490,737

(22) Filed: Apr. 18, 2017

(65) Prior Publication Data

US 2018/0079953 A1    Mar. 22, 2018

(30) Foreign Application Priority Data

Sep. 21, 2016  (KR) .................. 10-2016-0120889

(51) Int. Cl.
  *C09K 11/02* (2006.01)
  *C08K 3/013* (2018.01)
  (Continued)

(52) U.S. Cl.
  CPC ............ *C09K 11/025* (2013.01); *C08K 3/013* (2018.01); *C09K 11/703* (2013.01); *B82Y 20/00* (2013.01);
  (Continued)

(58) Field of Classification Search
  CPC ..... C09K 11/025; C09K 11/703; B82Y 20/00; B82Y 40/00; Y10S 977/774; Y10S 977/783
  See application file for complete search history.

(56) References Cited

U.S. PATENT DOCUMENTS 9,163,145 B2 * 10/2015 Radloff .................. C09D 5/024
9,202,997 B2 * 12/2015 Jane ........................ H01L 33/56

FOREIGN PATENT DOCUMENTS

CN     103597622     2/2014
CN     103619990     3/2014
(Continued)

OTHER PUBLICATIONS

PCT International Application No. PCT/KR2017/010049, Notification of Transmittal of the International Search Report and the Written Opinion of the International Searching Authority, or Declaration dated Dec. 20, 2017, 11 pages.
Zhu, M. et al., "Surface modification and functionalization of semiconductor quantum dots through reactive coating of silanes in toluene," Journal of Materials Chemistry, 2007, vol. 17, pp. 800-805, 6 pages.
(Continued)

*Primary Examiner* — C Melissa Koslow
(74) *Attorney, Agent, or Firm* — Lee, Hong, Degerman, Kang & Waimey

(57) ABSTRACT

A hybrid organic/inorganic quantum dot composite with high reliability is disclosed. The hybrid organic/inorganic quantum dot composite includes quantum dot, polymer resin, and silica, in which the silica is formed in the polymer resin, one end of the polymer resin forms a chemical bond with the quantum dot, and another end of the polymer resin includes a functional group capable of forming an additional chemical bond. The hybrid organic/inorganic quantum dot composite is resistant to moisture and oxygen permeation, and thus, it is not degraded easily by bonding oxygen and moisture to quantum dots even if moisture and oxygen permeate into the composite. The quantum dot composite may be used as a secondary raw material capable of being processed into another form while maintaining physical properties of quantum dots as a primary raw material.

10 Claims, 8 Drawing Sheets

(51) Int. Cl.
  *C09K 11/70* (2006.01)
  *H01L 33/50* (2010.01)
  *B82Y 20/00* (2011.01)
  *B82Y 40/00* (2011.01)
  *C08K 3/36* (2006.01)
  *G02B 5/22* (2006.01)
  *H01L 33/04* (2010.01)

(52) U.S. Cl.
  CPC ............... *B82Y 40/00* (2013.01); *C08K 3/36* (2013.01); *C08K 2201/001* (2013.01); *G02B 5/223* (2013.01); *H01L 33/04* (2013.01); *H01L 33/50* (2013.01); *H01L 33/502* (2013.01); *Y10S 977/774* (2013.01); *Y10S 977/783* (2013.01); *Y10S 977/818* (2013.01); *Y10S 977/824* (2013.01); *Y10S 977/892* (2013.01); *Y10S 977/896* (2013.01); *Y10S 977/897* (2013.01); *Y10S 977/95* (2013.01)

(56) References Cited

FOREIGN PATENT DOCUMENTS

| | | |
|---|---|---|
| CN | 105098075 | 11/2015 |
| KR | 1020150023206 | 3/2015 |
| KR | 1020160037091 | 4/2016 |
| WO | 2011008064 | 1/2011 |

OTHER PUBLICATIONS

Kango, S. et al., "Surface modification of inorganic nanoparticles for development of organic-inorganic nanocomposites—A review," Progress in Polymer Science, 2013, vol. 38, pp. 1232-1261, 30 pages.

State Intellectual Property Office of the People's Republic of China Application Serial No. 201710135216.2, Office Action dated Mar. 18, 2020, 20 pages.

* cited by examiner

FIG. 3

Hybrid Concept

DPHA(Dipentaerythritol Hexacrylate)

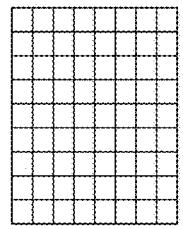

LOWER MOISTURE AND OXYGEN PERMEATION BY INCREASING CROSSLINKING DENSITY

LGE Hybrid Resin

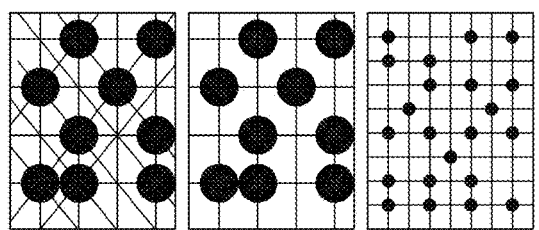

TRANSPARENCY IS HIGH AND MOISTURE AND OXYGEN PERMEATION IS LOW BECAUSE ORGANIC/INORGANIC COMPONENTS ARE CROSSLINKED WITHOUT ANY PHASE INTERBACE

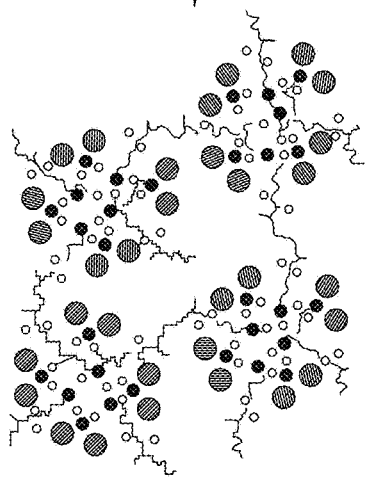

INTEGRAL-TYPE QUANTUM DOT COMPOSITE:
  WHEN QUANTUM DOTS SURROUNDED BY LIGAND INCLUDING SILANE GROUP ARE TOGETHER ADDED AND REACTED,
  INTEGRAL-TYPE QD COMPOSITE IN WHICH QUANTUM DOT-INORGANIC GROUP-ORGANIC GROUP ARE CHEMICALLY BONDED
  IS PREPARED

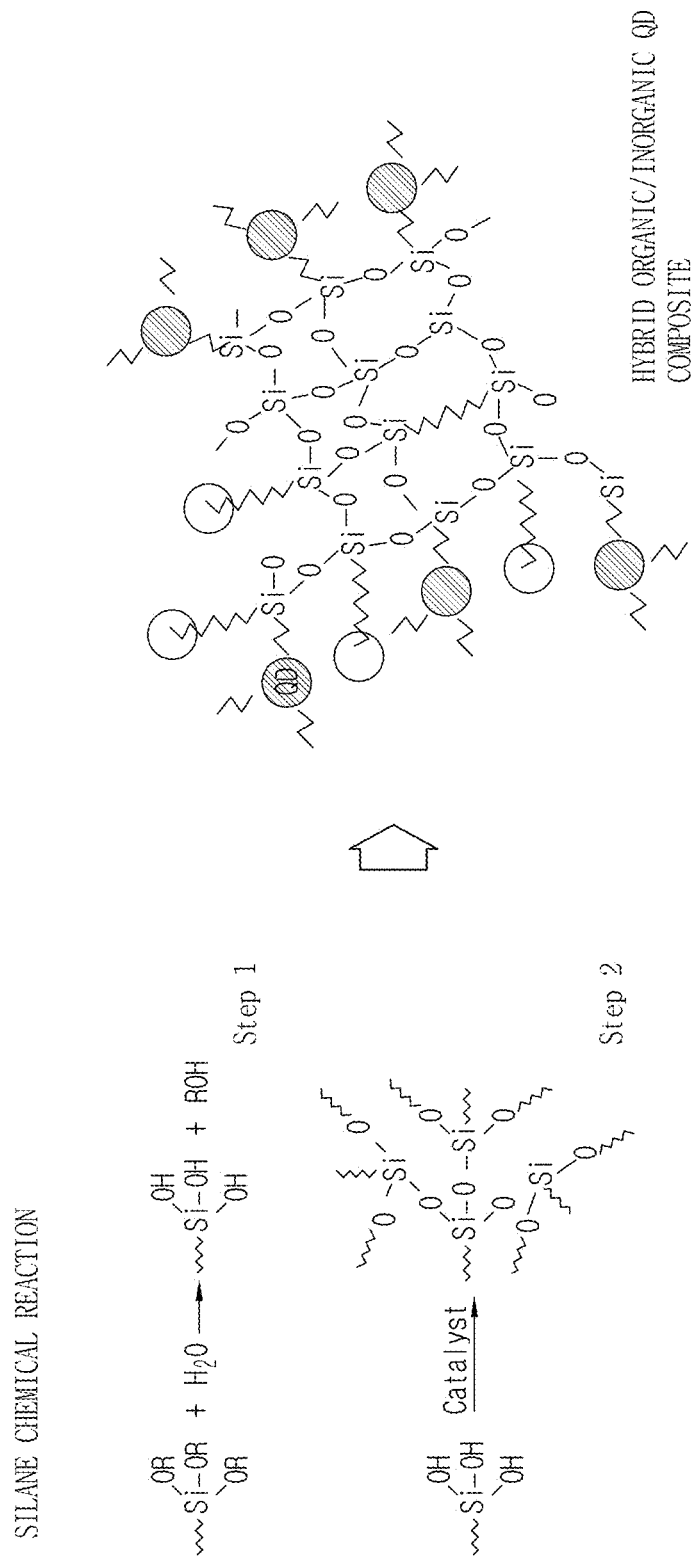

HYBRID ORGANIC/INORGANIC QUANTUM DOT COMPOSITE AND METHOD FOR PREPARING THE SAME

CROSS-REFERENCE TO RELATED APPLICATION

Pursuant to 35 U.S.C. 119(a), this application claims the benefit of earlier filing date and right of priority to Korean Application No. 10-2016-0120889, filed on Sep. 21, 2016, the contents of which are incorporated by reference herein in its entirety.

BACKGROUND OF INVENTION

1. Field of Invention

The present invention relates to a hybrid organic/inorganic quantum dot (QD) composite. In particular, the present invention relates to a highly reliable organic/inorganic hybrid quantum dot composite that is quite resistant to penetration by moisture and oxygen, and thus, it is difficult to be deteriorated even if it is penetrated by moisture and oxygen. Further, the present invention relates to a method for producing a highly reliable organic/inorganic hybrid quantum dot.

2. Background of Invention

Quantum dot is a semiconductor nanocrystal of nanometer size. The wavelength of a beam emitting light can be easily changed by changing the size of quantum dots, and a beam having a very narrow half-width can be obtained by controlling distribution of the quantum dot size. Quantum dots exhibit optical and electrical properties that are different from bulk materials because the size of the material becomes smaller and the band consisting of continuous energy states, inherently possessed by inorganic crystals, becomes discontinuous.

This can be explained as the quantum confinement effect, and the quantum confinement effect of each material varies depending on the Bohr radius of each material. This is known as a value determined according to the effective mass and dielectric constant of an electron and a hole of a semiconductor, and is the shortest distance which the electron and the hole may have in the bulk. When the particle size is smaller than the bore radius, the quantum confinement effect becomes very strong and large, causing the band gap of the material to become discontinuous.

As the band gap changes, the optical and electrical properties of the conduction band and the valence band are changed by the change of the electron and the hole movement, which means that desired characteristics can be easily derived from the material by adjusting the quantum limiting effect while controlling the size of the nanoparticles. In particular, quantum dots can emit various spectra having high quantum efficiency and excellent color purity by adjusting the size of the material compared to fluorescent dyes, and thus, have drawn attention as a promising light emitting material which may increase the color reproduction in the display and illumination fields and may make a light source of which the color purity is similar to that of the solar light.

With the recent development of the image field, there has been a need for a display capable of realizing a high color reproducibility. Various methods have been studied to solve such a technical problem. Among them, methods using quantum dots which emit a sharp beam have been the most widely studied. However, these quantum dots are very vulnerable to deterioration caused by reactions with various substances such as moisture and oxygen in spite of their excellent physical properties. Only after these disadvantages are solved, quantum dots can be developed into parts (components) having not only high color reproducibility, but also having applicability to various application fields.

Furthermore, in order to secure reliability and to apply to a specific field, it should be possible to develop quantum dots into new parts through the manufacturing process. In order to process quantum dots into new parts, the quantum dots need to be developed as a secondary raw material that can be processed into other forms while maintaining physical properties of the quantum dots as a primary raw material.

The quantum dot composite, which is the second raw material developed in this way, can be fabricated as a new optical component by applying it to a color photo resist (PR), a light-emitting diode (LED) chip, a light conversion film, and the like.

In order to manufacture devices utilizing these physical characteristics, it is essential to develop not only a process of manufacturing quantum dots into parts, but also develop a secondary raw material to be applied to the process and to maintain physical characteristics of the quantum dot.

SUMMARY OF INVENTION

Disclosed herein are a secondary raw material such as an ink capable of producing quantum dots into various forms and a reliable material that can maintain its physical properties and characteristics for a long time during or after componentization. In particular, the present invention is directed to producing an organic/inorganic hybrid quantum dot composite in which the quantum dots, the silica, and the polymer resin are all chemically bonded to form a single substance, thus making penetration by moisture and oxygen difficult.

Accordingly, the present invention provides a hybrid organic/inorganic quantum dot composite with high reliability, which includes quantum dots, a polymer resin, and silica. The present invention also provides a method of preparing the hybrid organic/inorganic quantum dot composite with high reliability.

The present invention further provides a hybrid organic/inorganic quantum dot composite composition including the quantum dot composite with high reliability. The present invention further provides an optical device such as a color filter including the quantum dot composite with high reliability.

Advantages of the present invention will be more apparent from the following detailed description, claims and accompanying drawings.

One aspect of the present invention is to provide a hybrid organic/inorganic quantum dot composite including quantum dots, a polymer resin, and silica, in which the silica is formed in the polymer resin, one end of the polymer resin forms a chemical bond with the quantum dots, and another end of the polymer resin includes a functional group capable of forming an additional chemical bond.

A general quantum dot is surrounded by hydrophobic ligands, and thus, is dispersed well in a hydrophobic solvent such as toluene, chloroform, hexane, cyclohexane, lauryl acrylate, lauryl methacrylate, isobornyl acrylate, isobornyl methacrylate, acrylate ester, hexyl acrylate, butyl acrylate, ethyl acrylate, and trimethylol propane trimethacrylate. However, the surface of the quantum dot is not completely surrounded by the ligands, and has a portion in which ligands are partially lost, and thus, as a result, the quantum dots may exhibit polarity, and are dispersed well only in a specific solvent without a change in physical properties. It is very difficult to prepare a uniformly dispersed quantum dot composite by mixing a material such as a monomer and an oligomer with these quantum dots. Due to the dispersion characteristic of such quantum dots, a material capable of being mixed with the composite is limited, and thus, it is very difficult to obtain a desired characteristic as a final part.

In addition, as an attempt to increase the reliability of the quantum dots, a quantum dot composite has been produced merely by increasing the cross-linking density of the matrix in order to prevent penetration by moisture and oxygen.

However, in the present invention, the quantum dots are chemically bonded to the resin by using silica, which is an inorganic material, and synthesized as a single polymer material, so as to increase the distance between the quantum dots by the molecular weight of the organic/inorganic materials between them. When a quantum dot composite having such a structure is synthesized, a quantum dot composite having a network composed of organic/inorganic materials is obtained, and as a result, the quantum dot composite can be dispersed very well without causing changes in wavelength conversion, half-width change and QY reduction due to agglomeration.

Specifically, unlike conventional quantum dot composites, the high-reliability organic/inorganic hybrid quantum dot composite according to the present invention has chemical bonds between quantum dots and resins. In the organic/inorganic hybrid quantum dot composite according to the present invention, not only the silica component surrounds the quantum dots, but also silica particles are formed in the resin, and the quantum dots, the silica, and the polymer resin all chemically bond to form a single substance. This feature makes it difficult for moisture and oxygen to penetrate, and even if penetrated, quantum dots are difficult to be deteriorated by reacting with them.

The hybrid organic/inorganic quantum dot composite with high reliability according to the present invention may be divided into quantum dots, a resin which surrounds the quantum dots, silica present in the resin, and an unsaturated functional group portion including an acryl group, a methacryl group, a vinyl group, an epoxy group, and the like capable of forming chemical bonds due to the curing.

The quantum dot may be a cadmium-based quantum dot, a II-VI Group quantum dot, a III-V Group quantum dot, a IV-VI Group quantum dot, or a I-III-V Group quantum dot, and in a general embodiment of the present invention, the quantum dot may be a non-cadmium-based quantum dot including InP, and may be a cadmium-based quantum dot including CdSe, CdTe, or CdZnS. In another exemplary embodiment of the present invention, the quantum dot includes one or more selected from the group consisting of CdS, CdSe, CdTe, ZnS, ZnSe, ZnTe, HgS, HgSe, HgTe, GaN, GaP, GaAs, InP, InAs, ZnSeTe, Mn:ZnSe, Cu:ZnSe, CdZnS, AlGaP, GaInP, AlGaP, and GaInP2.

Further, the quantum dot may have a core-shell structure. The quantum dots having a core-shell structure may grow a shell layer in various shapes by adding another component to the quantum dot in growing the crystal structure of a seed. If the core-shell structure is formed, the quantum dots have an advantage in that it is possible to simultaneously satisfy other characteristics such as thermal stability or insulating properties while satisfying characteristics such as high light emitting efficiency and high light emitting clarity.

In an exemplary embodiment, the quantum dot having a core-shell structure may be a quantum dot in which a shell having a band gap that is wider than the band gap of the core on the surface thereof, in which the shell on the surface has a band gap caused by a valence band having a lower energy than a valence band of the core and a conduction band having a higher energy than a conduction band of the core. The quantum dot having a core-shell structure may be selected from the group consisting of InP/ZnS, CdSe/ZnS, CdSe/CdS, CdSe/ZnSe, ZnSe/ZnS, Mn:ZnSe/ZnS, Cu:ZnSe/ZnS, ZnSeTe/ZnS, ZnTe/ZnS, AlGaP/ZnS, AlInP/ZnS, GaInP/ZnS, and CdZnS/ZnS, but is not always limited thereto.

In another exemplary embodiment, the quantum dot having a core-shell structure may have a core/insulating layer shell structure in which a functional organic semiconductor is bonded to the surface of the quantum dot. In this case, there is an advantage in that it is possible to provide new light emitting and electrical characteristics because the energy and the charge transfer efficiency may be adjusted between quantum dots and an organic semiconductor.

In the quantum dot composite according to the present invention, quantum dots form a chemical bond with a resin which surrounds the quantum dots.

In an exemplary embodiment, a functional group having an unshared electron pair capable of being coordinately bonded is present at one end of the resin, so that a coordination bond may be formed by providing an unshared electron pair to a quantum dot metal material which is a core.

The resin may be an organic silicone-based resin.

In the quantum dot composite according to an embodiment of the present invention, one end of the polymer resin forms a direct chemical bond with quantum dots as described above, whereas another end of the polymer resin includes a functional group capable of forming an additional chemical bond.

In yet another exemplary embodiment, the functional group present at another end of the resin is an unsaturated functional group selected from the group consisting of an acryl group, a methacryl group, a vinyl group, an alkenyl group, and an epoxy group.

When an unsaturated functional group such as an acrylate group is contained at the end of the resin, it has an excellent flowability and is easily dispersed with other materials. Such a quantum dot composite can be mixed with other materials or evaluated as an excellent secondary raw material which may be cured by itself. On the other hand, when such unsaturated functional groups are not contained or other functional groups having a saturated form such as an amino group are included, the flowability is poor and the value as a secondary raw material is reduced.

Thus, when the quantum dot composite according to the present invention containing an unsaturated functional group such as an acrylate group at the end of the resin is mixed with other materials, materials are easily mixed and desired characteristics can be obtained, because it is difficult for the quantum dots to approach each other and to aggregate. These hybrid organic/inorganic quantum dot composites can also have adjusted viscosity in the form of fluidal resin, and as a result, the processability is excellent. In addition, when such quantum dot composites are finally cured, the quantum dots are chemically bonded to the hybrid organic/inorganic resin to become an integral-type quantum dot plate which is one material, thereby exhibiting very high reliability.

Another aspect of the present invention provides a method for preparing a hybrid organic/inorganic quantum dot composite, the method including: (i) preparing quantum dot surrounded by a ligand, wherein one end of the ligand forms a chemical bond with the quantum dot and another end comprises a functional group that can form an additional chemical bond; (ii) adding a silane compound capable of forming a chemical bond with the functional group of the ligand to react the resulting mixture; and (iii) purifying and drying the reaction product obtained in step (ii).

(i) Preparation of Quantum Dots Surrounded by Ligands Having Two Functional Groups Capable of Being Bonded to Quantum Dots and Organic/Inorganic Material First, in order to link quantum dots to polymer materials, quantum dots surrounded by ligands need to be prepared by using a material having a functional group capable of being bonded to quantum dots and another functional group capable of being bonded to other organic/inorganic materials.

In an exemplary embodiment of the present invention, the quantum dots may be prepared by (a) preparing quantum dots surrounded by a first ligand and (b) substituting the first ligand with a second ligand, wherein one end of the second ligand forms a chemical bond with the quantum dot and another end of the second ligand comprises a functional group that can form an additional chemical bond.

Here, the second ligand may be one or more selected from compounds having a mercapto group, such as mercaptocarboxylic acid, mercapto alcohol, a mercaptoaldehyde compound, a mercaptoamine compound, and a mercaptosilane compound, but is not always limited thereto.

In another exemplary embodiment of the present invention, the quantum dots surrounded by the ligand may be directly synthesized by using a ligand having two functional groups capable of being bonded to quantum dots and an organic/inorganic material.

(ii) Addition and Reaction of Silane Compound

In order to form chemical bonds with organic/inorganic materials using the substituted quantum dots, it is required to add compounds having a functional group such as silane or silanol and silane acid which can form a chemical bond with the ligand of the quantum dot, and react the resulting mixture. The quantum dot composite obtained can be processed into a desired part shape through a processing step and then formed into a final one quantum dot plate through a curing reaction.

In order to have processability and to be manufactured as a final part after a light or thermal curing reaction, the composite synthesized as described above also needs to include a functional group such as an acryl group, a methacryl group, a vinyl group, an alkenyl group, and an epoxy group, which is capable of initiating a curing reaction.

Such silane compounds comprise 3-glycidyloxypropyltrimethoxysilane, 3-glycidyloxypropyltriethoxysilane, 3-methacryloxypropyltrimethoxysilane, 3-acryloxypropyltrimethoxysilane, vinyltrimethoxysilane, vinyltriethoxysilane, tetramethoxysilane, tetraethoxysilane, an oligomeric tetraethoxysilane, tetra-n-propoxysilane, 1,2-bis(triethoxysilyl)ethane, bis(triethoxysilyl)ethylene, 3-methacryloxypropyltrimethoxysilane, diphenylsilanediol, 3-aminopropyltrimethoxysilane, and phenyltrimethoxysilane, and the like, but are not always limited thereto.

When these materials are mixed together and the resulting mixture is reacted, it is possible to synthesize a hybrid organic/inorganic resin in which quantum dots are chemically bonded to silica.

At this time, in order to increase the ratio of silica, it is also possible to mix a silane such as tetramethoxysilane, tetraethoxysilane, an oligomeric tetraethoxysilane, tetra-n-propoxysilane, 1,2-1,2-bis(triethoxysilyl)ethane, and bis(triethoxysilyl)ethylene with these materials. These silane materials may be reacted with silane of the ligand and silane agents having a functional group capable of being light- or thermal-cured, thereby not only increasing the ratio of silica formed in the composite, but also increasing the crosslinking ratio of silica.

(iii) Purification and Drying

In order to purify a hybrid organic/inorganic quantum dot composite obtained as a result of a sol-gel reaction, it is possible to use a distillation method of separating a mixture in a liquid state into respective components by using a difference in vapor pressures of the respective components, a diffusion method of bringing at least one component dissolved in a solvent from a solution into contact with a gas which does not include the corresponding component to release (remove) the component from the solution, an absorption method of absorbing at least one component of a gas mixture in a solvent, and other methods usually used in the purification of an organic compound. When the distillation method is used, a simple distillation, a multi-step distillation, an azeotropic distillation, a water vapor distillation, and the like may be used, but the distillation method is not always limited thereto.

The drying conditions can be adjusted from 30° C. to 200° C., and the drying can be performed in vacuum or in the atmosphere.

Still another aspect of the present invention is to provide a hybrid organic/inorganic quantum dot composite composition including the quantum dot composite.

The hybrid organic/inorganic quantum dot composite composition may further include one or more additives selected from the group consisting of a silane compound, a polyfunctional acryl monomer, a polyfunctional epoxy monomer, an initiator, a UV stabilizer, an antioxidant, a toning agent (a colorant), a reinforcing agent, a filler, an antifoaming agent, a surfactant, and a plasticizer.

As described above, not only process characteristics of the composite, but also characteristics of the finally cured material may be adjusted by mixing a monomer, an oligomer, other additives, an initiator, and the like with the synthesized hybrid organic/inorganic quantum dot composite.

In order to further increase the crosslinking ratio during the optical/thermal curing process, the crosslinking ratio may be increased during the photo curing or characteristics of the finally cured quantum dot plate may be adjusted by mixing a polyfunctional acryl monomer such as dipentaerythritol hexaacrylate (DPHA), dipentaerythritol pentaacrylate, trimethylolpropane triacrylate, trimethylolpropane trimethacrylate, tripropyleneglycol diacrylate, triethylene glycol diacrylate, 1,6-hexanediol diacrylate, tetrahydrofurfuryl acrylate, pentaerythritol triacrylate, pentaerythritol tetraacrylate, diethylene glycol dimethacrylate, ditrimethylolpropane tetraacrylate, HDDA hexanediol diacrylate, trimethylolpropane triacrylate (TMPTA), trimethylolpropane trimethacrylate (TMPTMA), ethylene glycol dimethacrylate (EGDMA), TMP[EO]15TA, trimethylolpropane[EO]15 triacrylate, pentaerythritol [EO]n tetraacrylate, and polyethylene glycol 400 dimethacrylate with the composite. When epoxy is a main component of a curing reaction, the crosslinking ratio of a finally cured quantum dot plate may be increased by mixing a polyfunctional epoxy monomer with the composite.

Yet another aspect of the present invention is to provide an optical device selected from the group consisting of a plate, a color filter, an LED package, an LED chip, a color conversion filter, an optical conversion film, a QD film, an on chip, and a light emitting package, which include a hybrid organic/inorganic quantum dot composite.

The optical device according to the present invention may be formed by curing a hybrid organic/inorganic quantum dot composite composition including the quantum dot composite of the present invention.

A final optical device such as a plate including the hybrid organic/inorganic quantum dot composite according to an embodiment of the present invention is rarely reacted with oxygen, and thus, can be exposed in the atmosphere, and has a low degradation rate to moisture and oxygen even after being cured, and thus, does not need a separate barrier film.

FIG. 1 illustrates a flow chart of the entire process of preparing a final part such as a plate. The ligands of the synthesized quantum dots are substituted with other ligands such as mercaptopropionic acid, mercaptoethanol, and mercaptosilane. The substituted quantum dots are mixed with a catalyst and a molecule such as tetramethoxysilane, tetraethoxysilane, an oligomeric tetraethoxysilane, tetra-n-propoxysilane, 1,2-bis(triethoxysilypethane, bis(triethoxysilyl)ethylene, 3-methacryloxypropyltrimethoxysilane, diphenylsilanediol, 3-aminopropyltrimethoxysilane, and phenyltrimethoxysilane, and carry out sol-gel reaction. Here, the reaction can be carried out in various conditions at a reaction temperature from room temperature to 120° C., and the reaction time and the final molecular structure vary depending on the catalyst to be mixed. The quantum dot composite solution prepared as described above is purified and dried to manufacture a final quantum dot composite. Then, the final composite is mixed with a photo-initiator or a thermal curing agent, processed, and cured to manufacture a final quantum dot plate. When an additive such as an initiator is mixed with the composite, various monomers and additives may be mixed together in order to adjust the crosslinking ratio, characteristics of the material, adhesion characteristics, and the like.

FIG. 2 is a schematic view briefly illustrating a mechanism of preparing a quantum dot composite by each process step. In general, preparation of the quantum dot composite according to an embodiment of the present invention includes a) substitution of ligand, b) sol-gel reaction, c) drying, and d) formulation as described below.

The hybrid organic/inorganic quantum dot composite according to the present invention may be used as a secondary raw material capable of being processed into another form while maintaining physical properties of quantum dots which are a primary raw material. The hybrid organic/inorganic quantum dot composite according to the present invention maintains physical properties thereof and secures a reliability, thus maintaining the properties for a long period of time during the process of manufacturing the composite as a part or even after the composite is manufactured as a part such that the quantum dots can be utilized as a part without a barrier film, and thus, can be applied to various parts such as a color filter, a LED package, and a color conversion filter.

BRIEF DESCRIPTION OF THE DRAWINGS

FIG. 3 is a schematic view illustrating the concept of an integral hybrid QD composite in which quantum dot-inorganic-organic materials are chemically bonded by adding and reacting quantum dots surrounded by ligands having a silane group according to an embodiment of the present invention.

FIG. 4A illustrates a schematic view of a hybrid organic/inorganic quantum dot composite including quantum dots and a polymer resin which directly forms a chemical bond with the quantum dots, in which silica particles are included in the resin according to an embodiment of the present invention.

DETAILED DESCRIPTION OF INVENTION

Hereinafter, the present invention will be described in more detail through the Examples. These Examples are provided only for more specifically describing the present invention, and it will be obvious to a person with ordinary skill in the art to which the present invention pertains that the scope of the present invention is not limited by these Examples.

EXAMPLES

A) Synthesis of Quantum Dots and Ligand Substitution

Indium chloride ($InCl_3$) and zinc acetate ($ZnAc_2$) were put into 5 ml of oleylamine solvent at a mole ratio of 2 mmol:1 mmol, and the resulting mixture was vacuum-deaerated at 100° C. for 1 hour. The temperature was increased to 210° C., and then 1.5 mmol of tris(dimethylamino)phosphine was injected or added into the mixture, and reaction was performed for 20 minutes to form an InP core. 10 ml of a shell solution prepared in advance was injected or added into the core, and reaction was performed for 24 hours to form a ZnS shell. The shell solution was prepared by adding zinc stearate ($ZnSt_2$) and sulfur powder to 10 ml of a trioctylphosphine solvent at a mole ratio of 2 mmol:10 mmol, vacuum-deaerating the resulting mixture at 100° C. for 1 hour, and then increasing the temperature to 200° C.

An InP/ZnS quantum dot having a core-shell structure which was surrounded by ligands such as oleylamine, stearate, and trioctylphosphine was synthesized by using the colloid solution synthesis method, and a process of substituting the ligands with mercaptosilane (MPS) was performed.

Specifically, the test was performed at a ratio of the quantum dot solution (40 mg/ml):mercaptosilane (MPS) (20 mg/ml)=1:10 as a basis, and also at a ratio of 1:1 to 1:50. The test was performed at a temperature range of 30 to 100° C., and the substitution time was from 30 minutes to 24 hours.

B) Sol-Gel Reaction

The substituted quantum dots prepared in A), methacryloxypropyltrimethoxysilane, and a catalyst (DI water, HCl) were mixed, and the resulting mixture was reacted at a temperature of 70 to 80° C. for 12 hours. As the composition ratio of the sol-gel reaction, a ratio of the quantum dots (40 mg/ml):silane (methacryloxypropyltrimethoxysilane):the catalyst (DI water+HCl solution) was basically set as 1:5:5.

The ratio can be adjusted from 1:1:1 to 1:50:50 by increasing the ratio of the quantum dots, and the ratio of silane and the catalyst can also be adjusted from 1:1 to at least 1:10 or up to 10:1.

C) Drying Process

The drying condition can be adjusted from 30° C. to 200° C., and drying can be performed in vacuum or in the atmosphere depending on the conditions. In the present Example, a hybrid organic/inorganic quantum dot composite was prepared by performing drying at a temperature of 110° C. for 24 hours.

Figure 1:
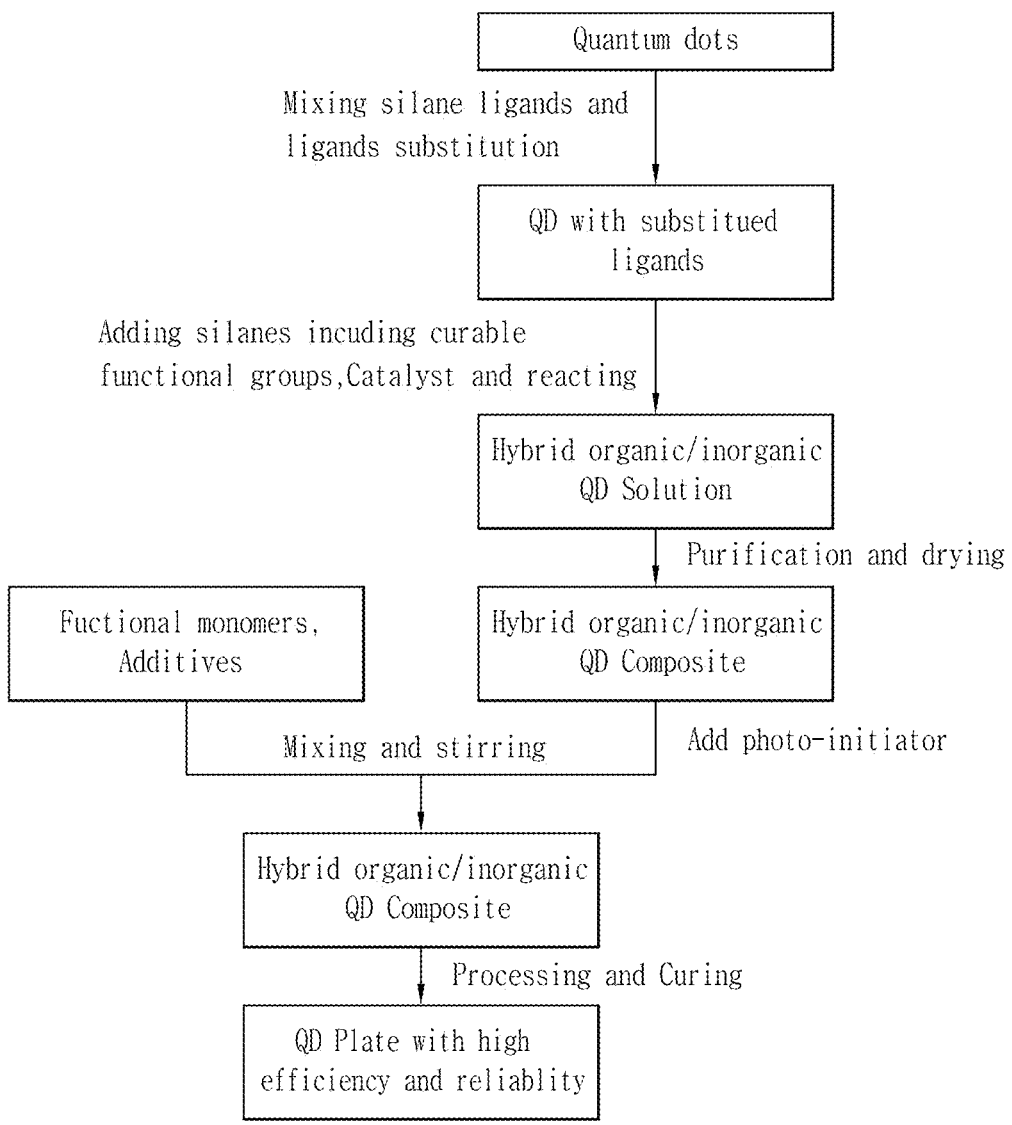
FIG. 1 illustrates a flow chart of the entire process of preparing a final part such as a plate according to an embodiment of the present invention.
Figure 2:
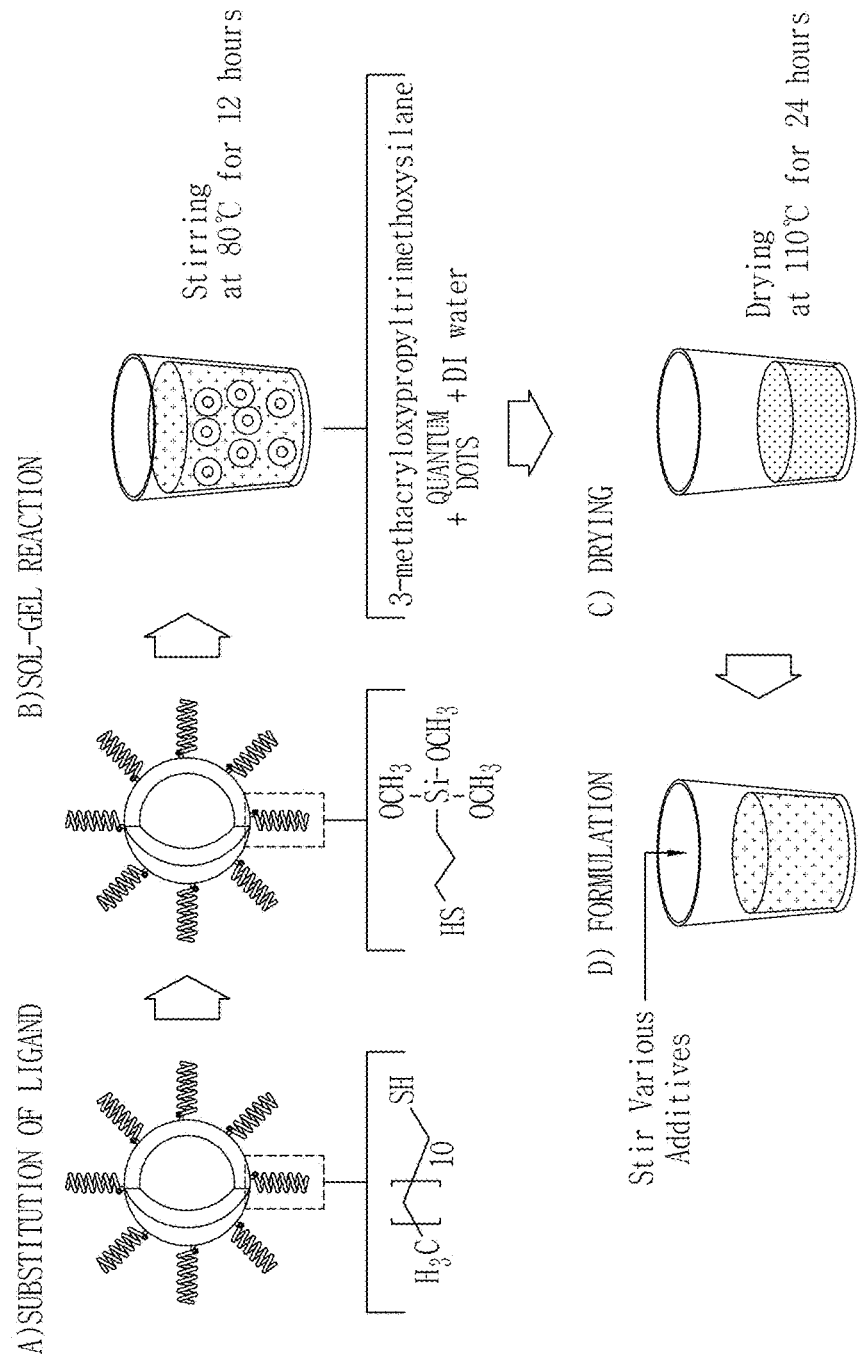
FIG. 2 is a schematic diagram briefly showing a manufacturing mechanism of a quantum dot complex according to process steps according to an embodiment of the present invention.
Figure 4B:
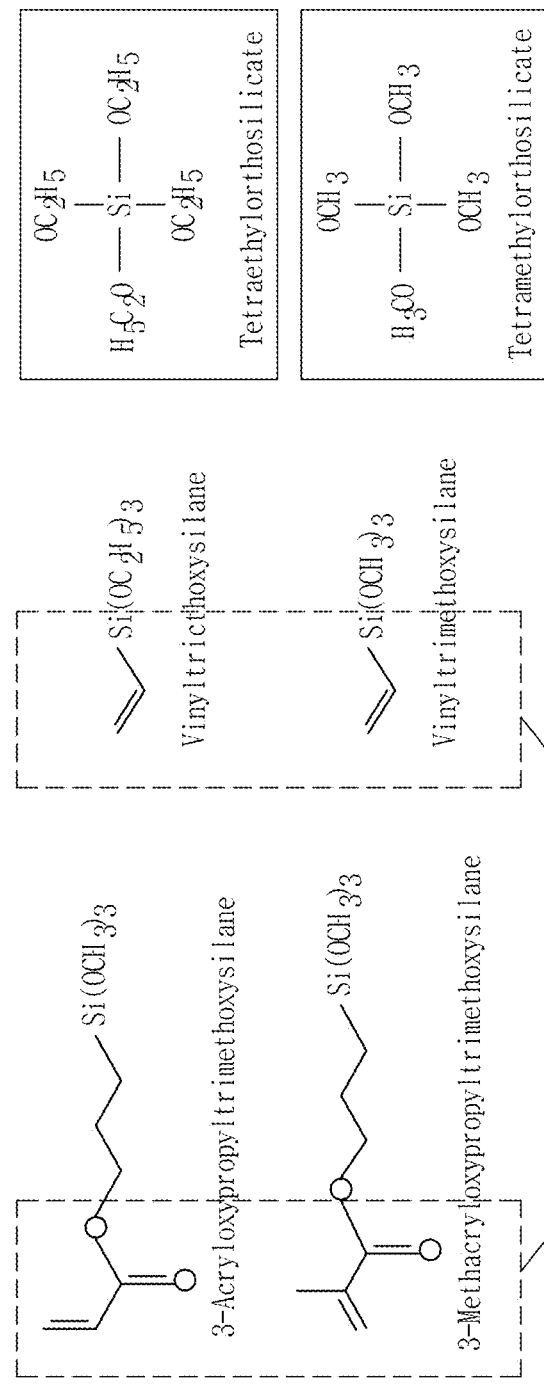
FIG. 4B exemplifies a molecular structure of a functional group which may be included at the ends of the resin according to an embodiment of the present invention.

FIG. 4A illustrates a schematic view of a hybrid inorganic quantum dot composite including quantum dots, polymer resin forming a direct chemical bond with the quantum dots, and silica particles included in the resin. Since an unsaturated functional group such as acrylate or vinyl is present at the end (a portion marked with a circle in FIG. 4A) of the resin prepared in the present Example, further chemical reactions are possible. The molecular structure of a functional group which may be included at the end of the resin is exemplified in FIG. 4B.

Measurement of Flowability

Figure 5A:
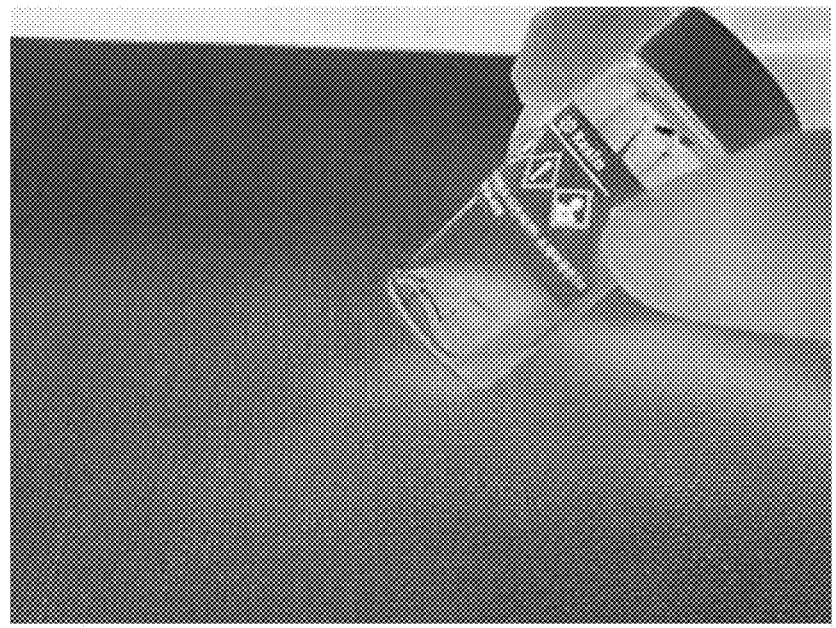
FIG. 5A shows a hybrid organic/inorganic quantum dot composite obtained when the ends of the resin include an acrylate group according to an embodiment of the present invention.

As described above, drying was performed at a temperature of 110° C. for 24 hours, and then the flowability of the QD-resin-silica composite was evaluated in accordance with the ASTM 1238. As a result of comparing the case where an unsaturated functional group such as acrylate is included as a functional group which may form an additional chemical bond at the end of the resin with the case where the unsaturated functional group is not included, it was confirmed that a hybrid organic/inorganic quantum dot composite including an unsaturated functional group such as acrylate at the end of the resin has excellent flowability because of the functional group capable of forming an additional bond in a curing process (FIG. 5A).

Figure 5B:
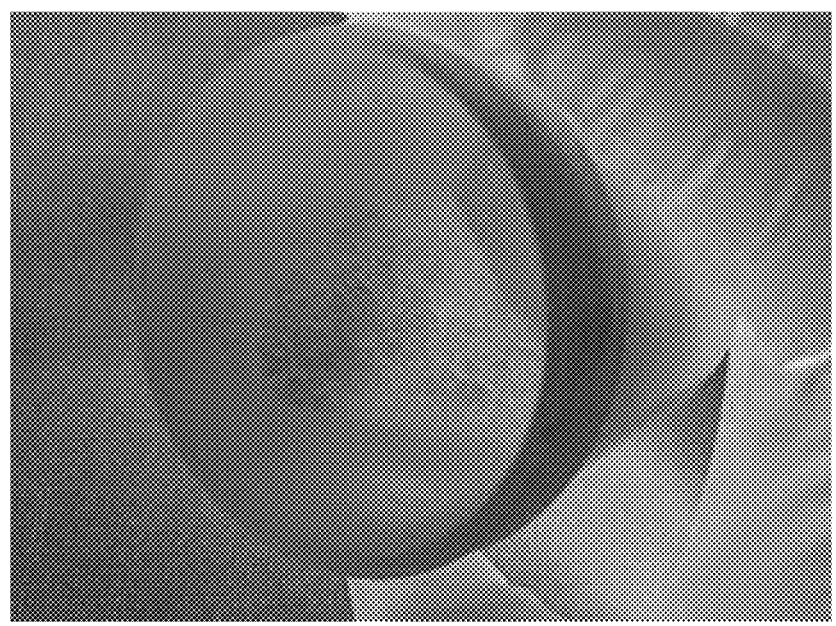
FIG. 5B shows a hybrid organic/inorganic quantum dot composite obtained by preparing the composite in the same manner as in FIG. 5a, except that an unsaturated functional group is not included at the ends of the resin according to an embodiment of the present invention.

On the other hand, even if having the same structure of QD-resin-silica composite, the physical property of the quantum dot composite having a saturated functional group such amino at the end of the resin was evaluated to determine whether it is powdery or brittle (FIG. 5B).

D) Formulation Process

A hybrid organic/inorganic quantum dot composite composition was prepared by mixing and stirring 5 wt % of photo-initiator, 0.1 wt % to 50 wt % of monomer, and an additive with the hybrid organic/inorganic quantum dot composite prepared as described above using a co-rotational apparatus. The viscosity can be adjusted according to the type and content ratio of monomer. It is possible to control the viscosity and impart various characteristics by mixing various monomers and additives. It was confirmed that the reliability tends to decrease when the ratio of the monomer and the additive added in this process increases.

E) Forming and Curing Process

Figure 6:
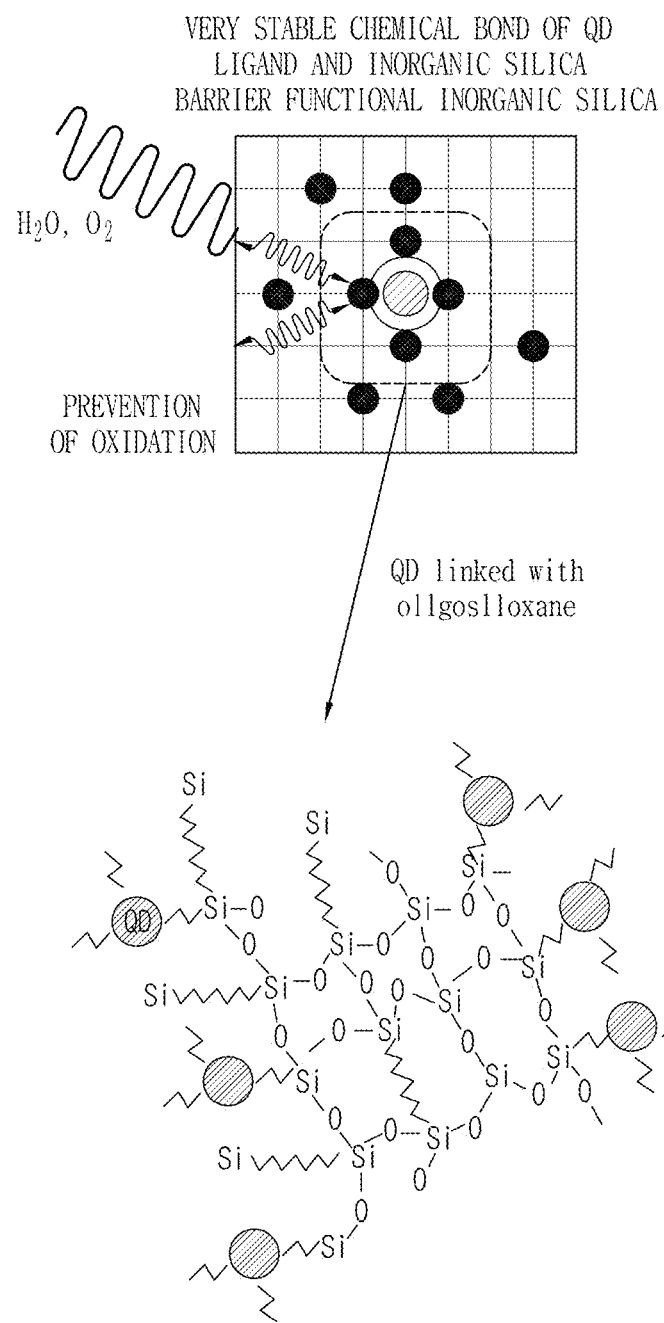
FIG. 6 illustrates an expected structure of a final quantum dot plate according to an embodiment of the present invention.

A quantum dot plate in which quantum dots, silica and a polymer are linked together by chemical bonding was formed and cured by a method of reacting the curable functional groups using UV radiation. FIG. 6 illustrates an expected structure of a final quantum dot plate, and FIG. 7 illustrates a graph showing reliability measured by cutting the samples thus obtained.

Figure 7:
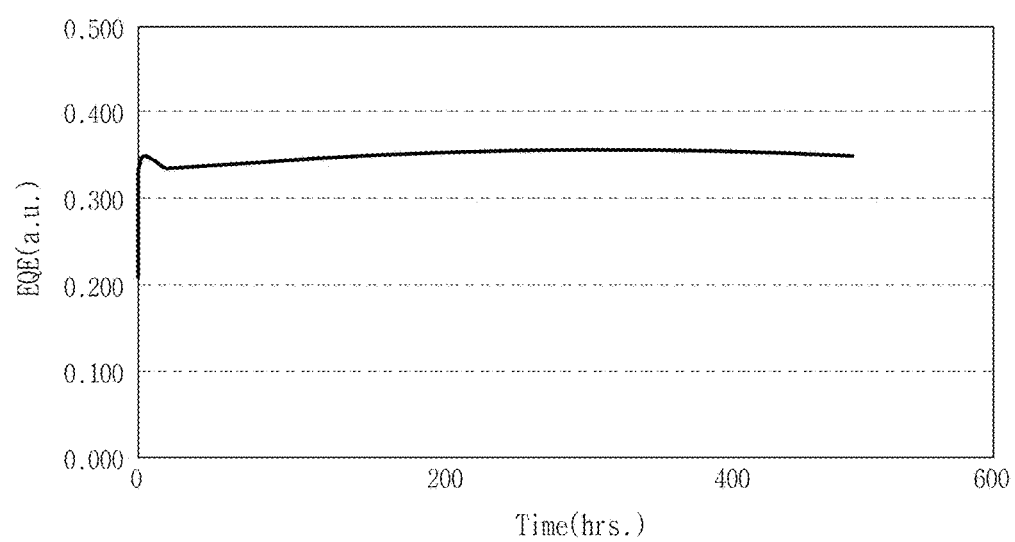
FIG. 7 illustrates a graph showing reliability measured by cutting samples obtained in the Example.

It was confirmed that the ligand is rarely desorbed even though a material capable of degrading quantum dots such as oxygen or moisture permeates into the quantum dot plate, and the quantum dot plate was firmly fixed with the hybrid organic/inorganic resin through the chemical bonds, and thus exhibited very high reliability without being degraded (FIG. 7).

What is claimed is:

1. A hybrid organic/inorganic quantum dot composite comprising:
   a quantum dot;
   a polymer resin; and
   a ligand,
   wherein:
   one end of the ligand and one end of the polymer resin are bonded by —Si—O—Si— bond,
   another end of the ligand forms a chemical bond with the quantum dot,
   another end of the polymer resin comprises a functional group capable of forming an additional chemical bond, and
   the functional group is an unsaturated functional group selected from the group consisting of acryl, methacryl, vinyl, alkenyl and epoxy.

2. The quantum dot composite of claim 1, wherein the quantum dot has a core-shell structure.

3. The quantum dot composite of claim 1, wherein the ligand forms a coordination bond with the quantum dot.

4. The quantum dot composite of claim 1, wherein the quantum dot is cadmium-based quantum dot, II-VI group quantum dot, III-V group quantum dot, IV-VI group quantum dot, or I-III-V group quantum dot.

5. The quantum dot composite of claim 1, wherein the quantum dot comprises InP, ZnSe, ZnTe, CdSe, CdTe, or CdS.

6. A hybrid organic/inorganic quantum dot composition comprising the quantum dot composite of claim 1.

7. The composition of claim 6, further comprising one or more additives selected from the group consisting of a silane compound, a polyfunctional acryl monomer, a polyfunctional epoxy monomer, an initiator, a UV stabilizer, an antioxidant, a colorant, a reinforcing agent, a filler, an antifoaming agent, a surfactant, and a plasticizer.

8. An optical device comprising the quantum dot composite of claim 1, wherein the optical device is selected from the group consisting of a plate, a color filter, an LED package, an LED chip, a color conversion filter, an optical conversion film, a QD film, an On Chip, and a light emitting package.

9. The optical device of claim 8, wherein the optical device does not comprise a barrier film.

10. The optical device of claim 8, wherein the optical device is formed by curing a hybrid organic/inorganic quantum dot composition comprising the quantum dot composite.

* * * * *